US008448105B2

(12) United States Patent
Dimou et al.

(10) Patent No.: US 8,448,105 B2
(45) Date of Patent: May 21, 2013

(54) CLUSTERING AND FANOUT OPTIMIZATIONS OF ASYNCHRONOUS CIRCUITS

(75) Inventors: Georgios Dimou, San Diego, CA (US); Peter A. Beerel, Encino, CA (US); Andrew Lines, Malibu, CA (US)

(73) Assignees: University of Southern California, Los Angeles, CA (US); Fulcrum Microsystems, Inc., Calabasas, CA (US)

( * ) Notice: Subject to any disclaimer, the term of this patent is extended or adjusted under 35 U.S.C. 154(b) by 548 days.

(21) Appl. No.: 12/429,772

(22) Filed: Apr. 24, 2009

(65) Prior Publication Data

US 2009/0288059 A1 Nov. 19, 2009

Related U.S. Application Data

(60) Provisional application No. 61/047,714, filed on Apr. 24, 2008, provisional application No. 61/162,090, filed on Mar. 20, 2009.

(51) Int. Cl.
*G06F 17/50* (2006.01)

(52) U.S. Cl.
USPC ......................................................... 716/103

(58) Field of Classification Search
USPC ................................................. 716/100, 103
See application file for complete search history.

(56) References Cited

U.S. PATENT DOCUMENTS

| 6,658,635 | B1 | 12/2003 | Tanimoto |
| 6,735,743 | B1 | 5/2004 | McElvain |
| 6,892,373 | B2 * | 5/2005 | Whitaker et al. ............. 716/104 |
| 6,993,731 | B2 * | 1/2006 | Whitaker et al. ............. 716/103 |
| 7,120,883 | B1 | 10/2006 | Van Antwerpen et al. |
| 7,624,368 | B2 * | 11/2009 | Whitaker et al. ............. 716/132 |
| 7,689,955 | B1 | 3/2010 | Van Antwerpen et al. |
| 7,694,266 | B1 | 4/2010 | Sankaralingam |
| 8,086,975 | B2 * | 12/2011 | Shiring et al. ................ 716/103 |

(Continued)

FOREIGN PATENT DOCUMENTS

| EP | 0501025 A2 | 9/1992 |
| EP | 2098969 A1 | 9/2009 |
| WO | 2008078740 A1 | 7/2008 |
| WO | 2009155370 A1 | 12/2009 |

OTHER PUBLICATIONS

Beerel, P.A. et al. Slack matching asynchronous designs. IEEE International Symposium on Asynchronous Circuits and Systems (ASYNC'06), 2006. (11 pages).

(Continued)

*Primary Examiner* — Suchin Parihar
(74) *Attorney, Agent, or Firm* — McDermott Will & Emery LLP

(57) ABSTRACT

Techniques are described for generating asynchronous circuits from any arbitrary HDL representation of a synchronous circuit by automatically clustering the synthesized gates into pipeline stages that are then slack-matched to meet performance goals while minimizing area. Automatic pipelining can be provided in which the throughput of the overall design is not limited to the clock frequency or the level of pipelining in the original RTL specification. The techniques are applicable to many asynchronous design styles. A model and infrastructure can be designed that guides clustering to avoid the introduction of deadlocks and achieve a target circuit performance. Slack matching models can be used to take advantage of fanout optimizations of buffer trees that improve the quality of the results.

23 Claims, 9 Drawing Sheets

U.S. PATENT DOCUMENTS

| | | | |
|---|---|---|---|
| 2005/0160392 A1* | 7/2005 | Sandbote | 716/18 |
| 2006/0120189 A1* | 6/2006 | Beerel et al. | 365/203 |
| 2006/0190889 A1 | 8/2006 | Cong et al. | |
| 2007/0256038 A1* | 11/2007 | Manohar | 716/3 |
| 2009/0119631 A1* | 5/2009 | Cortadella et al. | 716/6 |
| 2009/0271747 A1 | 10/2009 | Tanaka | |
| 2009/0288058 A1* | 11/2009 | Shiring et al. | 716/18 |
| 2009/0319962 A1* | 12/2009 | Manohar | 716/3 |
| 2010/0205571 A1* | 8/2010 | Manohar et al. | 716/3 |
| 2011/0029941 A1 | 2/2011 | Dimou et al. | |

OTHER PUBLICATIONS

Blunno, I. et al. Handshake Protocols for De-Synchronization. in Proc. International Symposium on Advanced Research in Asynchronous Circuits and Systems, Apr. 2004, pp. 149-158. (10 pages).

Cortadella, J. et al. Lazy Transition Systems and Asynchronous Circuit Synthesis With Relative Timing Assumptions. IEEE Transactions on Computer-Aided Design of Integrated Circuits and Systems, vol. 21, No. 2, Feb. 2002, pp. 109-130.

Cortadella, J. et al. From Synchronous to Asynchronous: an Automatic Approach. in Proc. of International, Design and Test in Europe Conference and Exhibition, 2004. (2 pages).

Cortadella, J. et al. Coping with the variability of combinational logic delays. Proceedings of the IEEE International Conference on Computer Design (ICCD'04). (4 pages).

Cortadella, J. et al. De-synchronization: Synthesis of Asynchronous Circuits from Synchronous Specification. in IEEE Transactions on Computer-Aided Design of Integrated Circuits and Systems. Oct. 2006, pp. 1-18.

Fant, K.M. et al. Null Convention$^{LOGIC}$™ a complete and consistent logic for asynchronous digital circuit synthesis. Proceedings of International Conference on Application Specific Systems, Architectures and Processors, Aug. 1996, pp. 261-273.

Fazel, K. et al. PLFire: A Visualization Tool for Asynchronous Phased Logic Designs. Proc. of International, Design and Test in Europe Conference and Exhibition, 2003. (2 pages).

International Search Report for PCT Application Serial No. PCT/US09/041682, mailed on Jun. 24, 2009.

Kondratyev, A. et al. Design of asynchronous circuits by synchronous CAD tools. In IEEE Design and Test of Computers, vol. 19, No. 4, pp. 411-414, Jul./Aug. 2002.

Ligthart, M. et al. Asynchronous Design Using Commercial HDL Synthesis Tools. in Proc. International Symposium on Advanced Research in Asynchronous Circuits and Systems, Apr. 2000, pp. 114-125. (12 pages).

Linder, D. H. et al. Phased Logic: Supporting the Synchronous Design Paradigm with Delay-Insensitive Circuitry. IEEE Transactions on Computers, vol. 45, No. 9, pp. 1031-1044, Sep. 1996.

Masteller, S. et al. Cycle decomposition in NCL. IEEE Design & Test of Computers, vol. 20, Issue 6, Nov.-Dec. 2003, pp. 38-43.

Meekins, K. et al. Delay insensitive NCL reconfigurable logic. IEEE Aerospace Conference Proceedings, vol. 4, 2002, pp. 4-1961 thru 4-1967.

Reese; R.B. et al. Arithmetic logic circuits using self-timed bit level dataflow and early evaluation. Proceedings of the International Conference on Computer Design, 2001.

Reese; R.B. et al. A coarse-grain phased logic CPU. Proceedings of the Ninth International Symposium on Asynchronous Circuits and Systems, May 2003.

Reese; R.B. et al. Early evaluation for performance enhancement in phased logic. IEEE Transactions on Computer-Aided Design of Integrated Circuits and Systems, Apr. 2005.

Reese; R.B. A coarse-grain phased logic CPU. IEEE Transactions on Computers, Jul. 2005.

Sotiriou, C. Implementing Asynchronous Circuits using a Conventional EDA Tool-Flow. In Proceedings of the 39th Design Automation Conference, pp. 415-418. The Association for Computer Machinery, Jun. 2002.

Sotiriou, C. et al. De-Synchronization: Asynchronous Circuits from Synchronous Specifications. 2003 IEEE, pp. 165-168.

Smirnov, A. et al. An Automated Fine-Grain Pipelining Using Domino Style Asynchronous Library. Proceedings of the Fifth International Conference on Application of Concurrency to System Design (ACSD'05) (9 pages).

Traver, C. et al. Cell designs for self-timed FPGAs. Proceedings of the 14th Annual IEEE International ASIC/SOC Conference, 2001.

Schuster, S. E. et al. 2003. Low-Power Synchronous-to-Asynchronous-to-Synchronous Interlocked Pipelined CMOS Circuits Operating at 3.3-4.5 GHz. IEEE Journal of Solid-State Circuits, vol. 38, No. 4, Apr. 2003, pp. 622-630.

Simlastik, M. et al. 2007. Clockless Implementation of LEON2 for Low-Power Applications. IEEE Design and Diagnostics of Electronic Circuits and Systems, 2007 (DDECS '07). IEEE, Apr. 11-13, 2007, 4 pages.

Office Action, dated Jun. 1, 2011, U.S. Appl. No. 12/421,963, filed Apr. 10, 2009, entitled "Power Aware Asynchronous Circuits," Ken Shiring et al., inventors. (Published as US 2009/0288058, Nov. 19, 2009).

* cited by examiner

PRIOR ART

```
clustering () { generate all allowable moves;
    calculate performance and area metrics for all moves;

while moves exist, such that performance metric >= 0
    {
        best_move = select_best_move();
        execute(best_move);
        delete all moves no longer allowable;
        generate new moves for affected circuit area;
        calculate performance and area metrics for all new and affected moves;
    }
} select_best_move()
{
    maxPerfMetric = -inf;
    maxAreaMetric = -inf;
    for every move m
    {
        if (movePerfMetric > maxPerfMetric)
        {
            maxPerfMetric = movePerfMetric;
            maxAreaMetric = moveAreaMetric;
            best_move = m;
        }
        else if (movePerfMetric == maxPerfMetric)
        {
            if (moveAreaMetric > maxAreaMetric)
            {
                maxAreaMetric = moveAreaMetric;
                best_move = m;
            }
        }
    }
}
```

CLUSTERING ALGORITHM

Initialize
{
    Run Floyd Warshall algorithm
}

Update(newNode) {
    Reinitialize_distance(newNode)
    Add newNode to searchlist
    While searchlist not empty {
        remove node from searchlist;
        update_distances_from_node(node);
        if any distance changed
            for each $s \in FI(node)$ not already in the searchlist
                add s to searchlist;
    }
}

Reinitialize_distance(s) {
    for all n
        if $n \in FO(s)$
            $d(s,n) = w(e_{s,n})$;
        else
            $d(s,n) = -\infty$;
} update_distances_from_node(s) {
    for all $m \in G$
        for all $n \in FO(s)$
            $d(s, m) = \max \{d(s, m), d(s, n) + d(n, m)\}$;
}

(A)

700B

Initialize
{
    Run Floyd Warshall algorithm
}

Update (newNode) {
    Reinitialize_distance (newNode);
    update_distances_from_node (newNode);
    for all $m \in FI(newNode)$
        update_distances_from_node_through_node (m, newNode);
    for all $m \in G$
        for all $n \in FI(newNode)$
            update_distances_from_node_through_node (m, n).
}

Reinitialize_distance(s) {
    for all n
        if $n \in FO(s)$
            $d(s,n) = w(e_{s,n})$;
        else
            $d(s,n) = -\infty$;
} update_distances_from_node(s) {
    for all $n \in FO(s)$
        for all $m \in G$
            $d(s, m) = \max \{d(s, m), d(s, n) + d(n, m)\}$;
} update_distances_from_node_through_node (s, p) {
    for all $m \in G$
        $d(s, m) = \max \{d(s, m), d(s, p) + d(p, m)\}$;
}

(B)

DISTANCE-UPDATE ALGORITHMS

FIG. 8
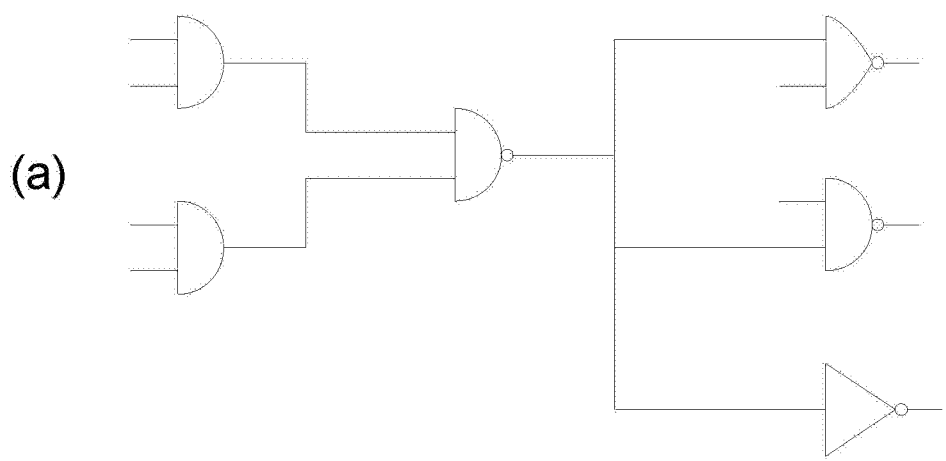
(a)
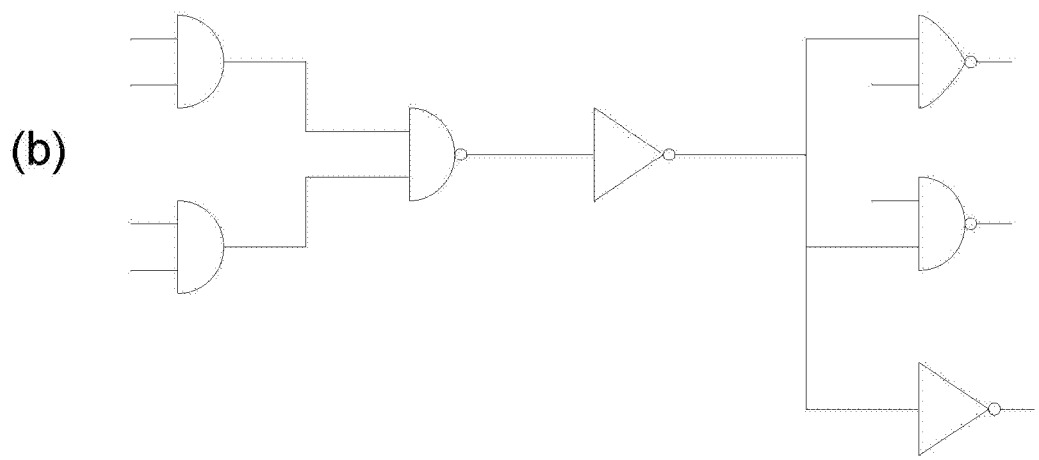
(b)
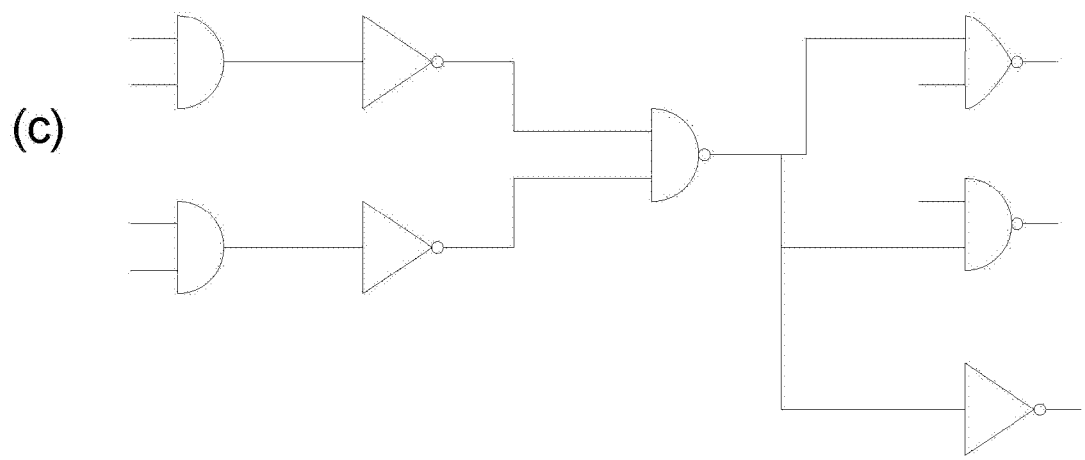
(c)

CLUSTERING AND FANOUT OPTIMIZATIONS OF ASYNCHRONOUS CIRCUITS

RELATED APPLICATIONS

This application claims the benefit of U.S. Provisional Patent Application No. 61/047,714, filed 24 Apr. 2008 and entitled "Performance-Driven Clustering and Fanout Optimization of Asynchronous Circuits; this application also claims the benefit of U.S. Provisional Patent Application No. 61/162,090, filed 20 Mar. 2009 and entitled "Clustering and Fanout Optimization of Asynchronous Circuits"; the entire contents of both of which application are incorporated by reference.

BACKGROUND

For synchronous electronic circuits relying on clocks and timing circuitry, all data is synchronized by a global circuit clock. In between combinational logic blocks, latches (e.g., flip-flops) are inserted, which function to latch the data once per period of the clock hence achieving the synchronization of data and control signals among the different circuit elements. In asynchronous circuits, synchronization is achieved through handshaking protocols that are implemented to assist the various circuit elements with the exchange of data. There are many styles of asynchronous design libraries and flows, and almost each one has a different handshaking mechanism associated with it.

For Handshaking protocols implemented for asynchronous circuits, the handshaking between two asynchronous units exchanging data often starts with the unit where the data is originating from sending a request to the receiver. Typically the request is sent when the data is ready and depending on the protocol this could be part of the data or a separate control signal. The receiver has to then acknowledge the receipt of the data. Then the transmitting module knows that the data has been consumed and can reset its value, in order to be ready to process the next set of data. This Request-Acknowledgement exchange can be performed in several different ways and handshaking protocols can be classified according to the nature of this exchange.

There are two distinct kinds of protocols commonly used for asynchronous circuits, the 2-phase and the 4-phase protocol. In the 4-phase protocol case the sender asserts its request (REQ) to inform the receiving element that it holds valid data on its output. The receiving element will then receive the data when it is ready to consume it and raise the acknowledgment (ACK) signal when it has actually done so. The sender will then reset its REQ signal and after that the receiver will lower its ACK signal. The second pair of transitions could also be used to explicitly identify a data reset phase. The 2-phase protocol only uses two active transitions to complete the communication handshake. Therefore, all transitions of the REQ/ACK signals are used in the same way, whether falling or rising. That means that during the first cycle the sender raises REQ and then the receiver raises ACK to finish the handshake. Instead of resetting the signals before the second communication, the protocol is implemented so that the sender lowers REQ to start the next transfer, and then the receiver lowers ACK to acknowledge the data. The request and acknowledgment signals could be individual signals or they could be implemented across the same wire. The later is also known as single-track communication.

The basic forms described above are for point-to-point communications between two adjacent units and the communication cycle is always initiated by the sender. When the sender initiates the protocol it is considered a push channel, and they are common in pipelined circuits. In other non-pipelined circuits, however, the receiver signals that it is ready first before the sender produces any data. This is known as a pull channel and the initial request is sent by the receiver and in the reverse direction of the data flow. For example an adaptation of the 4-phase protocol described previously for push channels can be used for pull channel communications. The receiver asserts the REQ signal to indicate that it is ready to accept data. When the sender has computed the data and put it on the channel it asserts its ACK signal. The receiver then lowers its REQ signal as soon as it has consumed the data. Finally the sender lowers its ACK signal after it has reset the data and the channel is now ready for the next transmission.

All the examples stated up to this point are examples of point-to-point communications. This means that the sender sends a signal to indicate the presence of data and releases the data when that gets acknowledged. Another quite interesting case is called enclosed communication. It is defined as the case where the REQ signal is asserted and then followed by an entire handshake from the receiver side (meaning the ACK is both asserted and de-asserted), before the REQ signal gets de-asserted. This type of behavior might not make a difference in a typical push pipelined channel, however its usefulness becomes apparent when considering cases where performing sequential actions is desired instead of concurrent actions. Assume that the sender wants to generate data and then there are multiple receivers that are going to operate sequential actions based on this data. The REQ signal can then be asserted to validate the data on the sender side. Then multiple receivers can take turns operating on the data and the REQ signals stays high validating its presence. When the last one of the receivers is done processing the sender can lower the REQ signal and reset the data. Additionally it can also be the case that some or all of these processes operate on the data with some level of concurrency as well.

Data encoding can be another way of classifying asynchronous channels based on the way that the data is encoded on the channel. The way that is closest to typical synchronous designs is called bundled data. In bundled data the data is presented in the form of a bus of single rail wires from the sender to the receiver. This has the benefit that only one wire per signal is only required and that the signals could be generated by single-rail combinational blocks just like those used for synchronous design. However there is no way to identify that the data is valid on the receiver end by just observing the data rails, hence the designer has to make sure that the data is all valid before the REQ signal becomes visible to the receiver. For this reason the REQ path has to be delay matched with the slowest combinational path between sender and receiver and this task is not trivial. Post layout simulation is typically required to ensure the functionality of the circuit.

Another way to encode data on a channel is by making it dual-rail. If the dual-rail signals are reset between transitions it is now easy to verify the presence of the data by the data itself by making sure that at least one of the two wires representing the data has been asserted. In this case an explicit REQ line is not necessary for the data, as a simple OR of the two signals verifies that the data is present. Dual-rail signals can also be grouped together in busses as in bundled data. If there is no explicit REQ like in the bundled-data rails all the individual OR results from each signal has to be combined to generate the global REQ signal for the bus. When one bit is transferred a single gate delay is added to the critical path, but in the later case the impact of such a circuit to the performance of the circuit could be significant since it could amount to several gate delays.

A more generalized for of dual-rail signaling is 1-of-N signaling. Here for every n wires that are used one can transmit log(n) bits. Out of the n wires only one is asserted at a time. This encoding has several benefits. Just like dual rail signaling there is no need for an explicit REQ signal since the presence of data can be extracted from the data itself (again assuming that the data is reset between transmissions). For such wide data paths the signals have to be broken up into smaller groups.

Another classifying characteristic of asynchronous communication channels is the type of timing assumptions that are required to hold for a particular protocol to operate correctly. In terms of the actual design process, the fewer timing assumptions that exist in a design the better, since timing assumptions usually have to verified through simulation that have to be performed both pre- and post-layout. The first timing model is one that all delays both gate and wire are allowed to assume any value, and the circuit is guaranteed to function properly. This model is called delay insensitive (DI), and it is the most robust model for asynchronous circuits.

Another category of circuits are Speed-Independent circuits (SI). In speed independent circuits gates could have arbitrary delays, but wire delays are considered negligible. This makes all forks isochronic, hence the QDI protocol requirement stands by default. With process geometries constantly shrinking though, wire delays become more and more dominant part of a path delay, and this assumption and the real delays need to be determined post-layout and the functionality of the circuit has to be verified again through simulation.

Scalable Delay Insensitive (SDI) is an approach that partitions the design in smaller parts and attempts to bridge the gap between DI and SI through this approach. Within each submodule the design is performed by bounding the ratio of delays between paths by a constant. It also defines a ratio related to the estimated and observed data on the delays that is also lower and upper bound. The same constant is used as a bound for both expressions. After each individual module is designed, the interconnections at the top level are designed based on DI assumptions.

Asynchronous Designs

PCFB and PCHB: The Pre-Charge Half Buffer (PCHB) and Pre-Charge Full Buffer (PCFB) are two example of a QDI template. Both templates are similar, but PCFB uses an extra internal state variable so that it is able to store one token per stage, and that is why it is called a Full Buffer. On the other hand a PCHB is a half buffer meaning that one token can exist in two adjacent pipeline stages. The templates are designed for fine-grain-pipelining, which implies that each pipeline stage is one gate deep. The data is encoded using 1-of-N encoding and thus there is no explicit request line associated with the data. Each gate has an input completion detection unit and the output also has an output completion detection unit. FIG. 1 includes two views depicting two prior art quasi-delay insensitive ("QDI") asynchronous circuit templates: (a) a pre-charged half buffer ("PCHB") 100A, and (b) a pre-charged full buffer ("PCFB") 100B, respectively.

The function blocks can be designed using dynamic logic (e.g., Domino logic) in order to reduce the size of the circuit. Another interesting property is that the function block can actually evaluate even if not all inputs are present yet. If the function allows it the function block can generate an output with a subset of the inputs and data can propagate forward along the pipeline. However the C-element will not send an acknowledgement to the left environment until all inputs arrive and the output has been generated. That prevents premature acknowledgments from propagating backwards to units that have not even produced data yet. The RCD is used to detect that data has indeed been generated from the function block. In the PCHB when both the LCD and RCD have detected valid data on both input and output the function block gets disabled. When the next stage in the pipeline acknowledges the outputs of the current stage then the function block will be pre-charged to be ready to receive the next set of data.

The LCD and RCD operate on 1-of-n encoded channels. Their operation is performed simply by performing an OR on the two wires. The data is reset to zero during pre-charge, therefore, the presence of data is detected when one of the two wires produces a logic 1. If multiple channels exist the results of the OR from each channel have to be combined together through C-elements to produce the output of the LCD/RCD. Even though this is a simple operation one has to remember that this a fine-grain-pipeline design style. For multi-input gates the control logic quickly becomes a large overhead and as a result these templates are not area efficient. Also even though the cells use dynamic logic for smaller size and better performance, there are several levels of control involved in the critical path. With PCHB being a half-buffer the cycle time involves multiple levels of logic as well as a completion detection unit and a C-element. Its cycle time varies depending on the functional block, but is generally between 14 & 18 transitions. The PCFB is a full buffer version of PCHB. It has the same cycle time as PCHB, so its only benefit would be slack capacity. For this reason the PCFB is not as widely used as the PCHB design style. Even though this yields good overall performance, there are design styles available that have much smaller cycle times.

MOUSETRAP is a recently proposed design style. It is a bundled-data protocol, with 2-phase control and could be used for both very fine-grain and coarser pipeline design. It has a very small cycle time of 5 transitions for a FIFO design and although the cycle time would increase with merges, fork and logic added to it, it still has the potential for very high throughput implementations. FIG. 2 depicts a basic diagram of a FIFO pipeline prior art MOUSETRAP design template 200.

MLD: Multi-Level Domino is another design style that also used bundles of wires, however here the data is encoded using differential encoding. The data path is constructed out of domino-logic gates in order to be more area efficient as well as faster. This also allows the circuit to generate a request to the next stage based on the data itself. A completion detection unit exists for each output and all the validity signals are then combined through an AND gate tree to generate the valid flag for the entire pipeline stage. The style is targeted more towards medium-grain pipelining and several layers of logic and many data paths in parallel are typically used in a single pipeline stage. This yields a small overhead from the addition of the pipeline stage control units and hence an area efficient design.

FIG. 3 depicts a prior art multi-level domino ("MLD") pipeline asynchronous circuit template 300. Even though there are differences between the variants in terms of the handshaking mechanism of the controllers and the generation of control signals, abstractly the general form of these styles can be illustrated in FIG. 3.

The cycle of a pipeline stage starts with the dynamic logic gates receiving data from the previous stage and evaluating their outputs. When the data propagates to the last stage of gates in the pipeline stage the outputs for the stage are generated and the dual-rail signals are used to validate that all outputs are present. The valid signal is generated for the entire stage and is used as a request to the next stage. It could also be used internally in the stage for isolating the outputs and initiating an early pre-charge of the logic before the final stage. When the next stage acknowledges the data, the stage resets its outputs to all zero so that the valid signal is forced low. The data path is connected normally just as in the case of a synchronous netlist. Any forking or merging between stages is handled by the controller circuits. That can be accomplished by inserting C-elements for the requests of signals reaching a merge and the acknowledgment signals departing a fork. The introduction of such elements might impact the cycle time of a stage, but since the data path is several stage long, this extra delay can be offset by reducing the amount of logic levels in a particular stage.

STFB and SSTFB: Single-Track Full Buffer is a design style for fine-grain pipeline design that uses 1-of-N encoding for the data and also 2-phase single-track handshaking between gates that is embedded in the data. It has been shown to yield very high throughput designs. There are several features of this design style that contribute to its high performance capabilities. Firstly the gates use dynamic logic internally for higher performance and reduced area. Secondly the gates have extremely small forward latency of 2 transitions and a total cycle time of 6 transitions. That is accomplished by embedding the control signals as part of the data path and the use of 2-phase handshaking.

In STFB the sender will receive data and evaluate its output and then immediately tri-state its output. The receiver detects the presence of data and evaluates only when all the data has been received. This is done by properly designing the stacks of NMOS transistors so that all paths to ground use all inputs. When the receiver evaluates its outputs it will actively drive the wires low and then tri-state the inputs. This signals the sender that the data has been consumed and it can evaluate the next set of data. The data is encoded in a 1-of-N fashion therefore for each communication only one wire in the set will transition. This wire is therefore used simultaneously for the data, request and acknowledgment signaling between the two cells. A problem with this template is that the data wires are not actively driven at all times. There are times that both transmitter and receiver will be in tri-state mode, hence the data becomes more susceptible to noise and leakage. Statisizers can be used to help alleviate this problem.

Local and Global Cycle Time: In the absence of a global clock, asynchronous circuit performance are often characterized using different metrics. When characterizing an asynchronous pipeline stage (could be as small as a single cell/gate for micro-pipelines) there are two important metrics to characterize performance. The first one is forward latency ("FL") and is measured as the time between the arrival of a new token, when the pipeline stage is idle, and the production of valid outputs for the next stage. This is a metric that is only dependant on the internal design of the pipeline stage. The second metric is called the local cycle time ("LCT"), and it is defined as the time between the arrival of a token and the time that the unit has reset itself back to the idle state and is ready to receive the next token. This number is generally affected by the next pipeline stages as well since the handshaking on the right side of the stage defines the time at which the stage can reset its output and proceed to get ready to accept new data. Both metrics are calculated during the design phase in terms of transitions, meaning the number of signal transitions that have to take place for the pipeline stage to move from one state to the next. Even though this is not directly translated into actual time, it is a useful first tool for tradeoff studies, design style comparison and performance estimation.

Once the local cycle time and forward latency is known there are several methods to do a more thorough analysis and find the performance of the entire circuit, and potentially identify the bottlenecks in the system. This is generally a very labor-intensive process that cannot be performed without a tool designed for this purpose, but the basic ideas can be intuitively described using the defined metrics of forward latency and local cycle time. The performance of a circuit is defined as the global cycle time ("GCT") of the circuit and it is essentially the metric that defines how many transitions it takes the circuit to process a token on average. Ideally the global cycle time is equal to the maximum of the local cycle time and the algorithmic cycle time ("ACT"). The algorithmic cycle time is the maximum for all cycles of the sum of the forward latencies of all the pipeline stages in the cycle divided by the number of tokens (data) that are in the cycle at any time. This is the maximum performance target for a design and the global cycle time cannot be improved beyond this point. However, the design might have a cycle time that is higher than this value, depending on the topology and the number of tokens in the design.

The reason that this might happen is that the performance is defined not only by how fast data can propagate down the pipeline, but how fast the pipeline resets to accept new tokens. The backward latency ("BL") of a pipeline stage is defined as the difference between the local cycle time and the forward latency and it can be perceived as the time it takes for a bubble—or empty position in the pipeline—to propagate backwards in the pipeline. Alternatively, the backward latency can also be defined as the time it takes a node to complete the handshaking with its neighboring cells and reset itself so that the next token can go through.

The forward and backward latency combined define the performance of a local pipeline stage. However the alignment of the data in the forward direction as well as the alignment of the bubbles in the backward direction is important to guarantee that a given global cycle time is achievable even if both the ACT and LCTs are all smaller than the requested global cycle time. This concept of alignment between the handshakes of the various stages is called Slack Matching, as is described in further detail below.

Due to the fact that asynchronous circuits require a handshaking controller for every pipeline stage, which is used to interface to adjacent pipeline stages, the logic overhead of such circuits is large. Moreover, there is a lack of an automated set of tools that would allow a designer to generate a circuit quickly from a behavioral Hardware Description Language (HDL), just like the ASIC flow that has existed for years for synchronous circuits.

SUMMARY

Aspects of the present disclosure are directed to techniques, including system, software, methods, and algorithms for asynchronous circuit design. Aspects and embodiments of the present disclosure can be used to generate asynchronous circuits (e.g., in the form of one or more netlists), from any arbitrary HDL representation of a circuit by automatically clustering the synthesized gates into pipeline stages that are then slack-matched to meet performance goals while minimizing area. Automatic pipelining can be provided in which the throughput of the overall design is not limited to the clock frequency or the level of pipelining in the original RTL specification. The techniques are applicable to many asynchronous design styles. A model and infrastructure can be designed that guides clustering to avoid the introduction of deadlocks and achieve a target circuit performance. This provides a framework for proper clustering that can enable the unhindered exploration of area minimization algorithms in the future and lead to optimized competitive designs. Slack matching models can be used to take advantage of fanout optimizations of buffer trees that improve the quality of the results.

An aspect of the present disclosure provides for an automated flow that can automatically generate asynchronous circuits from any HDL using a mixture of custom and existing industry tools. By grouping the circuits appropriately one can reduce this overhead and yield circuits that have competitive or even superior characteristics that their synchronous counterparts.

It should be understood that while certain embodiments/aspects are described herein, other embodiments/aspects according to the present disclosure will become readily apparent to those skilled in the art from the following detailed description, wherein exemplary embodiments are shown and described by way of illustration. The techniques and algorithms are capable of other and different embodiments, and details of such are capable of modification in various other respects. Accordingly, the drawings and detailed description are to be regarded as illustrative in nature and not as restrictive.

BRIEF DESCRIPTION OF THE DRAWINGS

It should be understood that while certain embodiments/aspects are described herein, other embodiments/aspects according to the present disclosure will become readily apparent to those skilled in the art from the following detailed description, wherein exemplary embodiments are shown and described by way of illustration. In the drawings:

FIG. 5 depicts pseudo-code for a clustering algorithm, in accordance with an exemplary embodiment of the present disclosure;

FIG. 7 includes views (a) and (b) depicting distance-update routines, in accordance with embodiments of the present disclosure; and FIG. 8 includes views (a)-(c) depicting placements of slack buffers, in accordance with various embodiments of the present disclosure; and The techniques and algorithms of the present disclosure are capable of other and different embodiments, and details of such are capable of modification in various other respects. Accordingly, the drawings and detailed description are to be regarded as illustrative in nature and not as restrictive. While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

Figure 1:
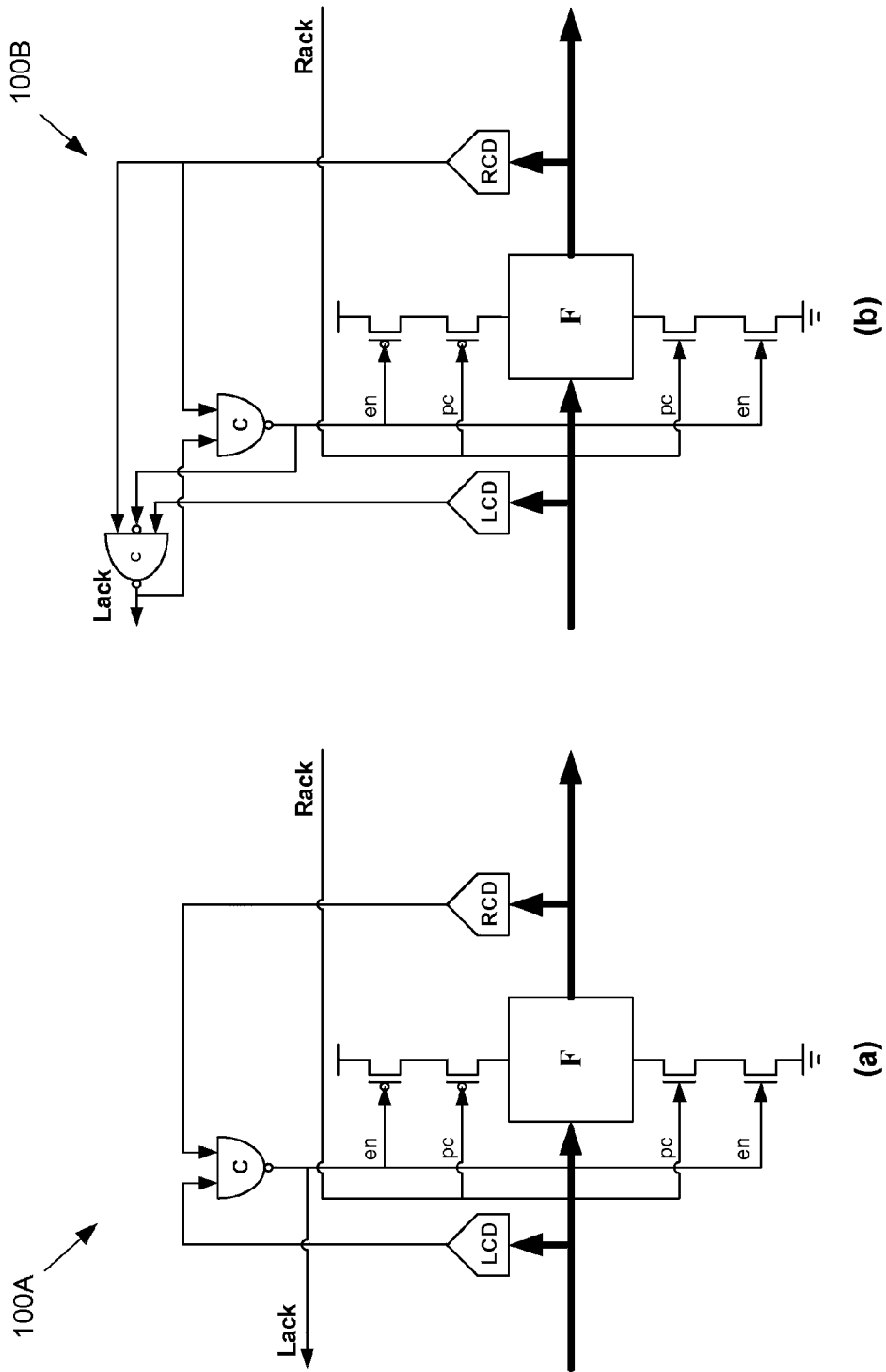
FIG. 1 depicts two prior art quasi-delay insensitive ("QDI") asynchronous circuit templates: (a) a pre-charged half buffer ("PCHB"), and (b) a pre-charged full buffer ("PCFB")
Figure 2:
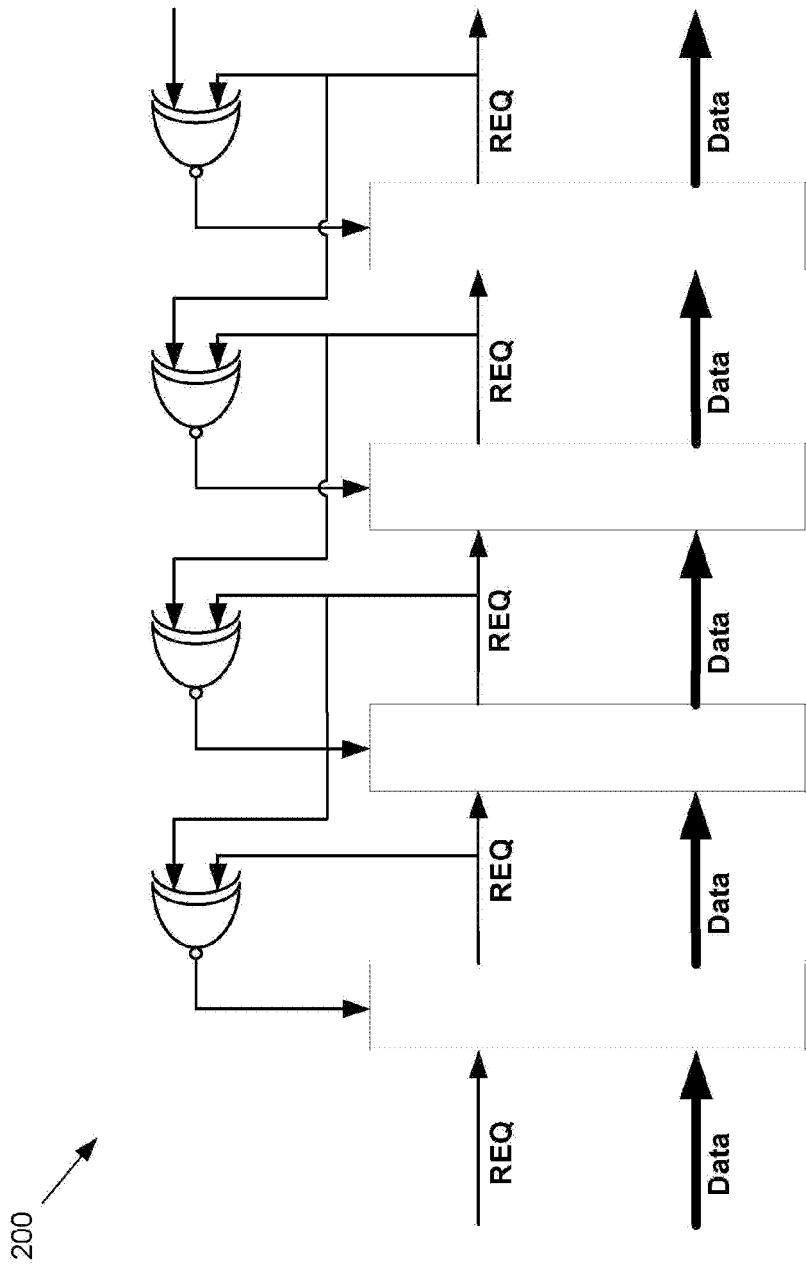
FIG. 2 depicts another prior art asynchronous circuit template referred to as MOUSETRAP.
Figure 3:
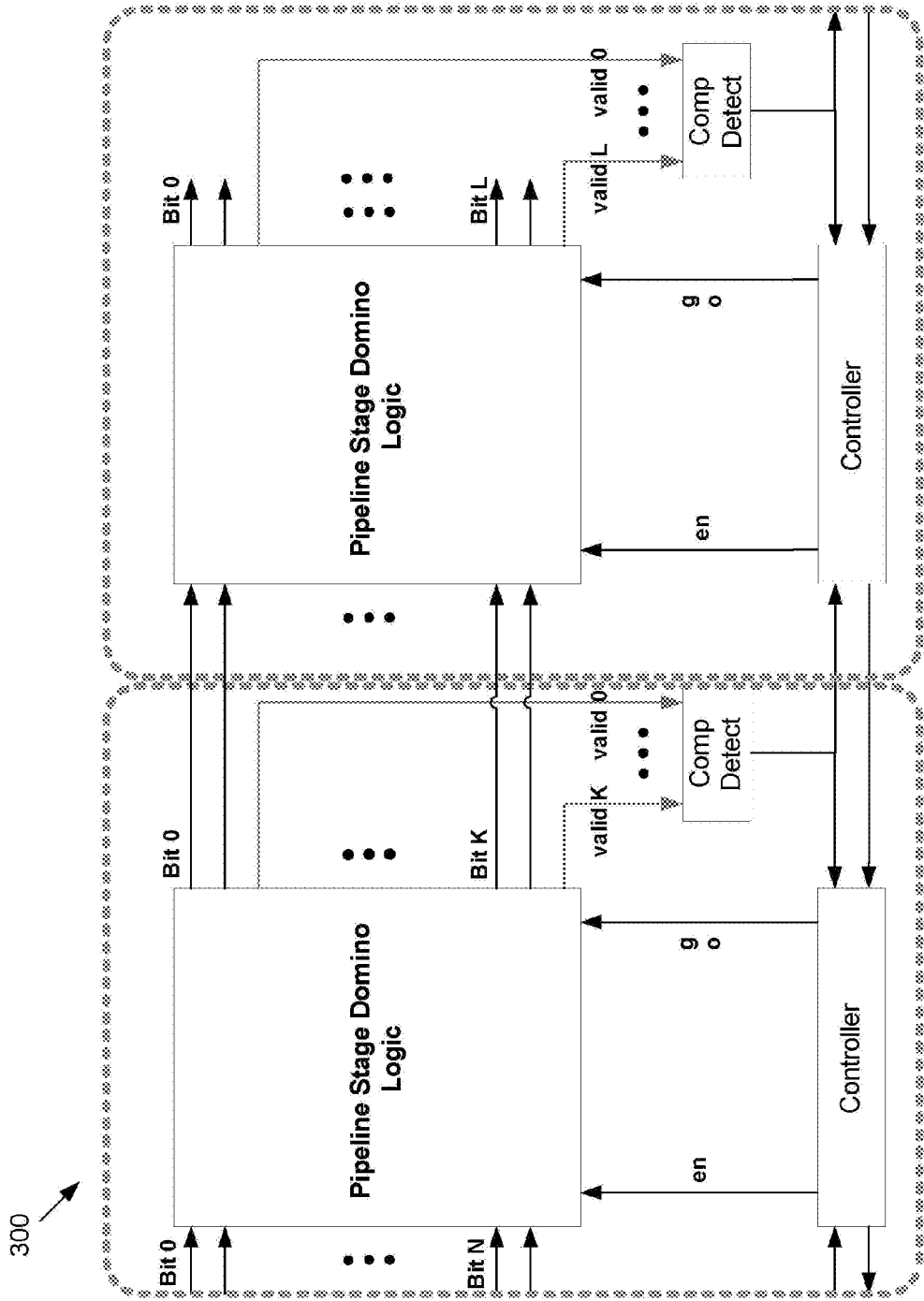
FIG. 3 depicts a prior art multi-level domino ("MLD") pipeline asynchronous circuit template.

Aspects and embodiments of the present disclosure are directed to techniques that can enable an ASIC design flow for the asynchronous circuit designs. Techniques are described for generating such circuits, from any arbitrary HDL representation of a circuit by automatically clustering the synthesized gates into pipeline stages that are then slack-matched to meet performance goals while minimizing area. Automatic pipelining can be provided in which the throughput of the overall design is not limited to the clock frequency or the level of pipelining in the original RTL specification. The techniques are applicable to many asynchronous design styles. A model and infrastructure can be designed that guides clustering to avoid the introduction of deadlocks and achieve a target circuit performance. This provides a framework for proper clustering that can enable the unhindered exploration of area minimization algorithms in the future and lead to optimized competitive designs. Slack matching models can be used to take advantage of fanout optimizations of buffer trees that improve the quality of the results. Commercial tools can be used and customized tools can be generated for design flow of asynchronous circuits.

Embodiments can provide a framework to enable an asynchronous ASIC flow that will enable engineers to design circuits using asynchronous design styles with the same ease and efficiency as they do for synchronous designs currently. To achieve this, embodiments of the present disclosure can provide a tool flow that resembles the standard synchronous ASIC flow and in fact reuses most of the existing parts and standard commercial tools. For such, a designer can start with a standard HDL input and use commercial synthesis engines to generate a synthesized image of the logic. A tool according to the present disclosure can takes the synthesized netlist and apply design transformation and optimizations that are unique to asynchronous design according to the present disclosure. After the tool is done it generates a netlist back into a standard format so that it can be imported into a standard back-end flow. That enables use of standard Place and Route, verification and simulation tools that are well known in the industry.

Embodiments of the present disclosure can ensure that the functionality of an asynchronous circuit is retained through clustering as well as other additional ones that ensure that both algorithmic cycle time and end-to-end latency do not deteriorate. Algorithms of the present disclosure can rely, as explained below, on maintaining a record of all distances from all the nodes to all the nodes of a graph. A distance-update or distance determining algorithm (e.g., one based on the Floyd-Warshall algorithm) can be used for deriving the initial distances.

Embodiments of the present disclosure are focused on performance of the resulting circuit designs. For many application of asynchronous circuit design, three limiting factors have been identified by the present inventors for the performance of an asynchronous circuit. The first one is algorithmic loops, which are addressed herein through by use of distance-based clustering algorithms and criteria. The second one is unbalanced paths and misaligned data in the pipeline, which is a problem solved through slack matching as described herein. The third limiting factor is the local cycle time ("LCT") of a channel, which can make a local handshake the critical path of a circuit.

It will be understood that the processes, methods, and algorithms according to the present disclosure can be run in or implemented with suitable computer or processing systems, e.g., ones with suitable processors or processing functionality, suitable memory, and/or suitable I/O functionality; moreover such can be implemented with or embodied within suitable software in any suitable computer readable language (machine dependent or machine independent).

A. Overview of ASIC Flow

Figure 4:
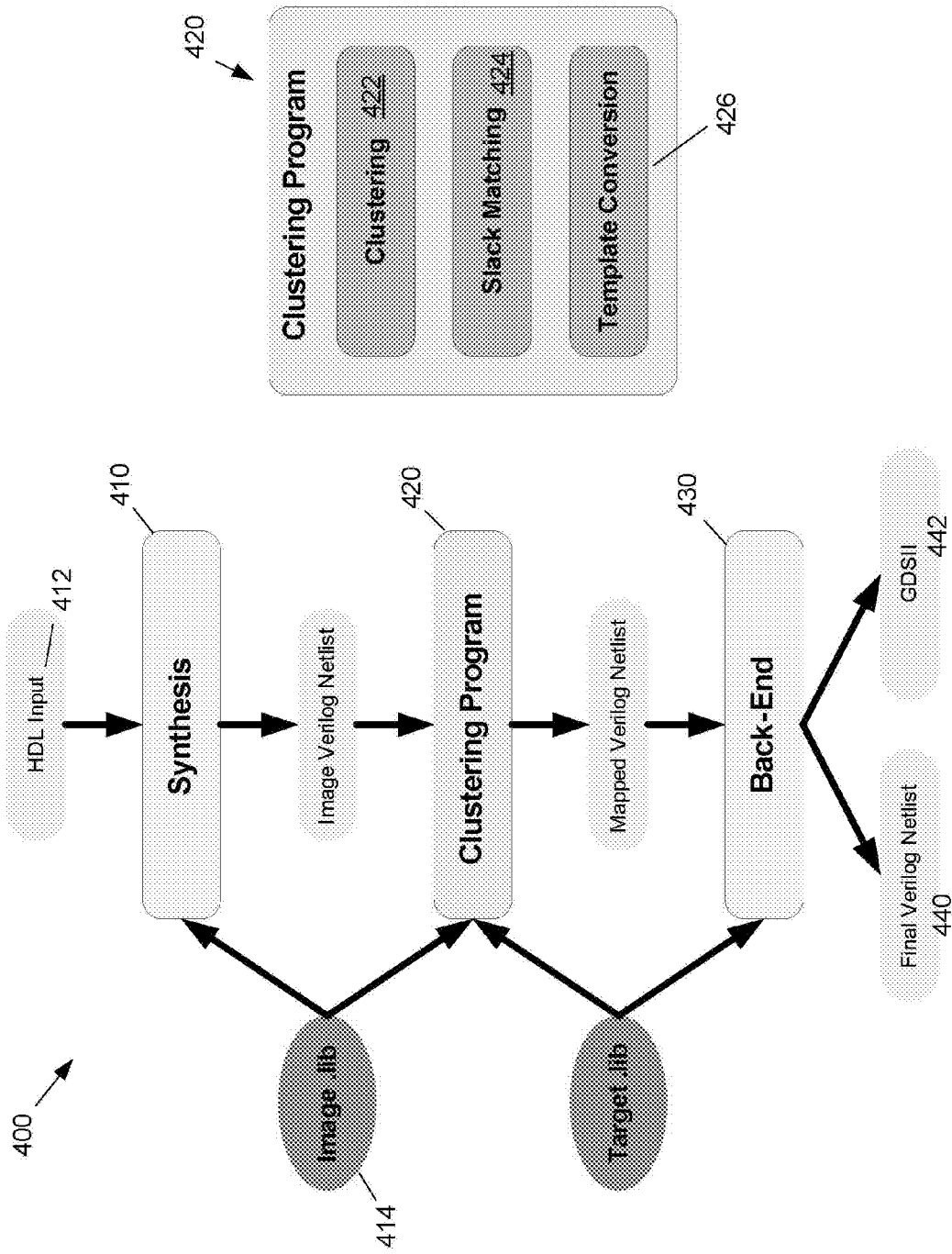
FIG. 4 depicts an ASIC flow for asynchronous circuits, in accordance with exemplary embodiments of the present disclosure.

FIG. 4 depicts an ASIC flow (or process) 400 of designing asynchronous circuits, in accordance with exemplary embodiments of the present disclosure.

A preliminary issue when designing an asynchronous circuit, e.g., according to flow 400, is dealing with forks and merges in the data path. Due to the fact that the handshaking signals required for synchronization propagate along with the data, extra gates usually have to be added to make sure that the request and/or acknowledgement signals get combined so that the correctness of the protocol is maintained. If care is not taken, it is easy to have the system fail because of a deadlock at a join, due to improper acknowledgement (or request) along one of the two merging paths. These additional gates usually are on the critical path and have to be taken into consideration in order to avoid impeding performance. Also paths going through forks and joins are also likely to be parts of cycles or re-convergent paths and the cycle time analysis has to be performed to verify that the design performance is not reduced.

B.1. Synthesis

As shown in FIG. 4, a first process in a flow 400 is synthesis 410. This can be accomplished in commercial synthesis tools to convert the design to a synchronous Verilog netlist. A first input can be a synchronous specification, e.g., a HDL netlist, as shown by 412. The initial synchronous specification can be performed from a behavioral HDL or RTL HDL, which could be defined in any language that is supported by the commercial synthesis tools. A second input to the tool can be library information 414. The library information can effectively act as an "image" library that abstracts the asynchronous gate details for the synthesis tool (such as whether they are dual-rail or single-rail, their handshaking ports and protocols, etc.), but includes all the information that is useful for it to do a proper design (such as timing, power, area, etc.).

A benefit of this flow 400 is that instead of trying to generate a new tool, pre-existing tools, which have been refined through years of research, can be used to perform good optimizations, and include predefined and optimized design components such as adders and multipliers that can be used in the data path. So by placing appropriate constraints one could use ripple-carry or carry look-ahead adders to trade between latency and area. Other tasks, such as buffer insertion and gate resizing could be performed as well, by changing the input constraints for the design. In most cases relaxed constraints are enough, since they yield the simplest data path, but if one wanted to shorten the data path due to a large algorithmic cycle time in the final design, modified constraints could be used to force the compiler to generate a different netlist.

B.2. Clustering Program

A second stage of asynchronous ASIC flow 400 is a clustering program or algorithm 420. As shown in FIG. 4, clustering program (algorithm) 420 can receive an image netlist (e.g., in Verilog) from synthesis program/algorithm 410.

Most asynchronous design styles allow for multiple gates to be placed within the same pipeline stage. Generally that is done to reduce the area overhead associated with the control logic that is used for handshaking between every pipeline stage and its neighbors. The control logic is large and the more efficiently it gets shared among many gates the smaller the penalty that one has to pay for the asynchronous design style conversion. Depending on the design style the number of gates per pipeline cluster varies widely, but it is believed that the same principles apply in all cases. Also most asynchronous design styles share other design rules, such as limits on fanin/fanouts per pipeline cluster and others. Finally all asynchronous circuits have to obey similar rules about Local Cycle Time, Target Cycle Time and Algorithmic Cycle Time, e.g., as described in further detail herein. All of these parameters can depend on the size and interconnect of the different clusters in the final netlist. Accordingly, embodiments of the present disclosure can minimize the area of the final netlist by grouping gates together as well as possible, but at the same time obeying all the design constraints that are specific to a particular design style and also maintain the functionality and the performance requirements that the designer specified when defining the HDL description of the circuit.

B.2.1 Circuit Representation

With continued reference to the ASIC flow 400 of FIG. 4, as part of synthesis 410, after the original netlist (e.g., Verilog) input file for the synchronous circuit is read, the netlist can be converted to a generic directed graph structure, with the instances and primary IO converted into nodes and the wire interconnect represented by edges. The original Verilog input file can be converted into a generic graph structure, which can be manipulated more efficiently during the different optimization operations that are run during processing. Initially the tool reads the entire netlist (flat netlist with no hierarchy) and creates a single pipeline stage out of every gate in the original netlist. Accordingly, the tool can be provided with flexibility in terms of clustering, and also start with very simple pipeline clusters that should generally meet any give performance targets more easily.

B.2.2. Clustering

Having formed the fundamental one-gate clusters, a clustering program/algorithm 420 can be implemented, which allows for grouping them in larger groups without violating the performance requirements of the design and at the same time preserve the original functionality intended by the user. Exemplary embodiments of the present disclosure employ a heuristic optimization for clustering based on area and performance criteria that implements a steepest-descent-type of algorithm. A focus of the present disclosure is on correctness of the resulting circuit as well as preservation of the performance requirements. The runtime of such heuristic approaches can be relatively short and thus provide an advantage of allowing the testing of larger circuits.

Continuing with the description of clustering/algorithm 420, clustering (e.g., as shown at 422) can be performed by merging two clusters into one (we refer to this as a local move) and executing one such move at a time. During each iteration, the software/algorithm can look at all possible moves that are available and execute the one that has the largest performance benefit. It can also estimate the area gains from the potential merging, and use the area benefits to break ties in the case that many moves have the same performance improvements. The area metric is an area estimate of the control logic that can be removed by executing the particular move. The performance metric is an error metric associated with the Target Cycle Time of the circuit and the Local Cycle Time of the individual channels. For each channel an error metric is calculated that is equal to the amount that the LCT violates the GCT. For each move the performance metric is the difference between the sum of errors for all channels before the move and after the move. The larger the metric, the more LCT improvements the move will achieve.

After each move, the algorithm discards all moves that are no longer feasible and generates new ones from the region of the circuit that was affected and then repeats the process. This avoids costly recalculation of all move data at each step. The algorithm does not select any move that would make the metric worse and thus in practice avoids making LCT worse than the GCT and affecting the performance of the circuit, thus addressing the last and final parameter that could affect performance. The moves can also checked for other local rules that are associated with particular design restrictions for the design style that is being targeted and are not related to either performance or correctness. For example TOKEN_BUFFER cells are cells that for all templates are initialized during reset with particular data values, unlike regular cells that do not hold data after reset. Those can only be placed in pipeline stages that host similar types of cells. When the clustering algorithm cannot find any candidate local moves to execute it stops. FIG. 5 depicts an embodiment of a suitable clustering algorithm 500, which can be used to ensure that LCT does not grow/increase.

B.2.3. Fanout Fixes

Continuing with the description of 420, as the circuit is generated using synchronous tools and design libraries, there can be certain restrictions in some of the different design styles in terms of the number of fanout gates that each gate will drive. Sometimes this is due to the particular protocol—for example single-track 1-of-N channels (such as those in SSTFB) only support point-to-point connections—or due to performance restrictions (fanout load of the gate or depth of C-element trees required for merging ACK signals). When the given netlist does not obey these restrictions, the program can intervene and correct these faults by instantiating fanout trees for problematic signals using buffer cells, e.g., as described below. This step can be executed if necessary before moving on to create a final netlist.

B.2.4. Final Optimizations

With continued reference to FIG. 4, after clustering is done the software/algorithm can also performs slack matching 424 on the netlist. Other local optimizations can be performed on the netlist during this final stage to ensure the best quality of results. Gate replication can be used to reduce the levels of logic in certain cases and buffers are inserted in some cases if it is deemed that the operation might help performance. In general, these are minor implementation details that help a practical design.

B.2.5. Library/Template Conversion

The next step in 420 is to implement a library/template conversion 426 generate a new netlist that instantiates the actual gates that will be used for implementation from the selected asynchronous implementation design. The program also needs to generate and instantiate all the additional control logic that is necessary for the handshaking between the pipeline stages that were defined during clustering and slack matching.

For exemplary embodiments, the final gates used are dual rail gates, even though for other design styles that is not necessarily the case. All the nets in the original netlist can be converted into pairs of nets each representing the true and false rails of the original single rail signal. The gates can be converted to their dual rail counterparts and the wires can be interconnected appropriately. With a dual rail library, inversions of inputs and outputs can be handled by swapping the two wires attached to a gate. During this step all gates are converted to their non-inverting counterparts, and the inversion of inputs and outputs takes place by inverting the dual-rail wires. Even though the single rail library uses image gates that include all permutations of possible inversions of inputs and outputs, the final library includes only the non-inverted versions, reducing the amount of library cells that are required for a complete library implementation. Special signals such as power, ground and a global asynchronous reset are also generated. When all the gates have been converted the completion detection trees are formed and the controllers for the pipeline stages are instantiated. The merge and fork cells for the primary inputs and outputs are also instantiated, and the handshaking signals for the left and right environment are added to the top level module.

B.2.6. Verification

Continuing with the description of flow 400, the software package/tool (implementing algorithm 400) can create additional information for verification of the resulting design(s). A header file can be written that contains some important parameters for the design, such as the number of inputs, outputs and vectors that are going to be used. Another file that contains a random number generator can also be copied to the design directory. Then the software can generate a testbench for the synchronous netlist as well as a testbench for the asynchronous one. A script can also be written out that includes the commands needed for running the tests.

The script file commands will first call the random generator module and generate an input file for both simulations that uses random data at all inputs. After this the synchronous netlist is run given the input vectors and the output vectors are recorded at every cycle and sent to a file. The script then executed the command to simulate the asynchronous netlist with the same input file. The results of this run are compared against the results of the synchronous netlist and if they match the testbench will indicate that the test completed successfully. Otherwise it will indicate a failure. At the same time the testbench samples the design outputs and average the number of tokens received over time to calculate the global cycle time in the design.

B.3. Simulation and Back-End Design

Asynchronous ASIC flow 400, can include a back-end process 430 including simulation and/or verification of the outputted asynchronous netlist 440. In exemplary embodiments, a default simulation that a program performed was done in NC-Sim to verify that the translation was successful. However since the netlist is in regular Verilog format, further simulation in any commercial simulator is possible. The Verilog Netlist can also be used as is by commercial back-end tools to perform place and route and verify the performance of the circuit. Back-annotation could also be used for post-layout simulations if desired. However, the flow currently does not support ECO flows and post-layout optimizations. Therefore if the netlist is not yielding the desired results and changes are necessary, the design might have to be processed again from the beginning. Alternatively hand-editing might be able to alleviate the problem if it is easy to identify and fix. Post-layout analysis and ECO-type fixes to the netlist is an interesting and potentially necessary future step.

Thus, ASIC design flows according to the present disclosure, e.g., flow 400, have been proven in practice to work. Several exemplary designs have been take through to completion, including place & route to produce GDSII, e.g., shown as 442 in FIG. 4. GDS II stream format, common acronym GDSII, is a database file format which is the de facto industry standard for data exchange of integrated circuit or IC layout artwork. It is a binary file format representing planar geometric shapes, text labels, and other information about the layout in hierarchical form. The data can be used to reconstruct all or part of the artwork to be used in sharing layouts, transferring artwork between different tools, or creating photomasks. In implemented embodiments, the netlists started from RTL-level code (Verilog) and were taken through synthesis, with a clustering and slack-matching tool and then implemented in a Place and Route process through Cadence's Encounter tool suite. Such results can provide functional netlists that can successfully place and route and produce functional circuits that re ready for fabrication.

Thus, the present disclosure provide a modeling framework that allows a designer of asynchronous circuits to perform the clustering of the logic gates into pipeline stages by modeling the logic onto an implementation-independent (or "agnostic") graph. This can allow the clustering of any arbitrary circuit from its gate-level logic representation into pipeline stages of an asynchronous circuit of any desired design style. Depending on the implementation style, the clustering constraints can be modified to yield a functional circuit that abides by all design rules for the particular style.

With the right formulation of the local constraints and appropriate performance and area models for a particular design style one can use this work to design any type of asynchronous pipeline that one desires starting from a gate-level representation of the desired circuit. That means that one could start from any regular HDL representation of a circuit and use a conventional synthesis engine to convert it to gates. Then using this model one could use it to create a pipelined circuit for any design style of their choice. It is believed that this method, since it maintain the functionality and performance of the original circuit, while optimizing its area by clustering, could be used as part of a much broader ASIC flow that would be applicable to all types of asynchronous circuits.

C. Clustering Details—Exemplary Embodiments

The clustering of the gates, e.g., by program 420, inside larger pipeline stages allows the circuit to reduce the control overhead and make the different design styles competitive to not only each other, but also their synchronous counterparts. Exemplary clustering techniques of the present disclosure can preserve the functionality of a circuit and not introduce structures that make the circuit unable to meet its performance requirements, as described in further detail below.

Circuits usually are designed subject to performance constraints that are derived from system requirements. Even though it is interesting to find the "fastest" a circuit can run or the "smallest" it can be made, practically it is not very useful, since the circuit requirements are always defined by system parameters that are not dictated by the circuit capabilities, but by the overall system function. Therefore clustering techniques of the present disclosure address a variety of design requirements.

C.1. Circuit Abstraction

An initial step to abstract the circuit into a more generic structure is to formulate the problem mathematically. This structure is a weighted directed graph $G=(V,E,h,m)$, where V is the set of nodes in the netlist. $V=PI \cup PO \cup CL \cup TB$, where PI is the set of primary inputs, PO is the set of primary outputs, CL is the set of combinational gates and TB is the set of flip-flops or TOKEN_BUFFERS. All four set PI, PO, CL, TB are mutually disjoint sets. E is the set of directed edges $E \subset (V \times V)$. The notation $e_{i,j}=(v_i,v_j)$ can be used for an edge in E to simplify the notation for a directed edge that starts from node $v_i$ and ends in node $v_j$. E may be required to not contain any self-loops $e_{i,i}$. A function $h:E \to \Re^+$ can usefully be defined that is used to map an edge onto a positive real number that represents the forward latency of the edge. A function $m:E \to \{0,1\}$ can be defined such that $$m(e_{i,j}) = \begin{cases} 1, & v_i \in TB \\ 0, & \text{otherwise.} \end{cases} \quad (1)$$

A path $p_{i,j}$ can be defined as a sequence of edges in E, the first edge in the sequence starting from node $v_i$, and the last edge in the sequence ending in node $v_j$ and such that for all other edges in the sequence, their starting point is the ending point of the previous edge in the path and their ending point is the starting point of the next edge in the path. It can be assumed that a path goes through each node once (simple path). A cycle as a path $p_{i,i}$ can be defined that starts and terminates at the same node $v_i$. One can also define $P_G$ as the set of all paths that exist in the G.

Another important input is a target performance metric, which can be defined in terms of the target cycle time (TCT) of the circuit and may be defined as $\tau_{goal}$. The algorithmic cycle time (ACT or $\tau_{alg}$) of the circuit can be defined, which is the lower bound of $\tau_{goal}$ beyond which $\tau_{goal}$ is no longer achievable. Thus $\tau_{goal} \geq \tau_{alg}$. Having defined a path, the algorithmic cycle time can be defined as:

$$\tau_{alg} = \max_{v_i \in V: \exists p_{i,i} \in P_G} \left\{ \frac{\sum_{e_{j,k} \in p_{i,i}} h(e_{j,k})}{\sum_{e_{j,k} \in p_{i,i}} m(e_{j,k})} \right\} \leq \tau_{goal}. \quad (2)$$

The weight of an edge can be defined $w_{i,j}=w(e_{i,j})=h(e_{i,j})-m(e_{i,j})*\tau_{goal}$. Accordingly, the following convention can be derived:

$$w(e_{i,j}) = h(e_{i,j}) - m(e_{i,j}) * \tau_{goal} = \begin{cases} h(e_{i,j}) > 0, v_i \in PI \cup CL \\ h(e_{i,j}) - \tau_{goal} < 0, v_i \in TB. \end{cases} \quad (3)$$

The weight of a path can be defined as an extension of the edge weight—that is the sum of the weights of all edges in the path sequence, so $$w(p_{i,j}) = \sum_{e \in p_{i,j}} w(e_{i,j}).$$

A definition can be given to the length of a path as the number of edges in the sequence of the path. So $L(p_{i,j})=|p_{i,j}|$.

A distance between two nodes $v_i$ and $v_j$ can be defined as the maximum weight of all valid paths from $v_i$ to $v_j$, or as $-\infty$ if no paths exist from $v_i$ to $v_j$, which can be denoted as $$d_{i,j} = \begin{cases} \max_{\forall p_{i,j} \in G} \{w(p_{i,j})\}, & \text{if } \exists \, p_{i,j} \in P_G \\ -\infty, & \text{otherwise.} \end{cases} \quad (4)$$

The transitive fanout ("TFO") and combinational transitive fanout ("CTFO") as well as transitive fanin ("TFI") and combinational transitive fanin ("CTFI") can be defined as follows:

$$TFO(v_i)=\{v_j: \exists p_{i,j} \in P_G\},$$

$$TFI(v_j)=\{v_i: \exists p_{i,j} \in P_G\},$$

$$CTFO(v_i)=\{v_j:\exists p_{i,j}\in P_G \wedge \neg \exists e_{k,l}\in p_{i,j}:v_k\in TB\}, \text{ and}$$

$$CTFI(v_j)=\{v_j:\exists p_{j,i}\in P_G \wedge \neg \exists e_{k,l}\in p_{j,i}:v_k\in TB\}. \quad (5)$$

So essentially the $CTFO(v_i)$ (and equivalently the $CTFI(v_i)$) is the set of all nodes that are reachable from $v_i$ (or equivalently for CTFI that can reach node $v_i$) through a path that does not go through a TOKEN_BUFFER node.

A formal definition can be given for the local move operation: a local move is a function on the graph G=(V,E,h,m) that produces a new modified graph G'=(V',E',h,m). It essentially takes two nodes $v_i,v_j\in V$ and replaces them in V' with a unified new node $v'_k\in V'$ that contains the contents of both nodes (in circuit terms that would be the instances and wires internal to the pipeline stages that correspond to the original nodes $v_i$ and $v_j$). The rest of the nodes of V are preserved in V'. Mathematically:

$$V'=V-\{v_i,v_j\}+\{v'_k\} \quad (6)$$

If both $\exists e_{i,j} \wedge \exists e_{j,i}\in E$ the move is not allowed because this case would generate a self-loop in the graph (a cycle of length 1). Otherwise, when combining nodes $v_i$ and $v_j$ into the new node $v'_k$, the edges in the set E' are generated as follows:

$$\exists e_{m,i}\in E \vee \exists e_{m,j}\in E \text{ with } m\neq i,m\neq j \text{ then } \exists e_{m,k}\in E'.$$

$$\exists e_{i,m}\in E \vee \exists e_{j,m}\in E \text{ with } m\neq i,m\neq j \text{ then } \exists e_{k,m}\in E'.$$

$$\exists e_{m,l}\in E \text{ with } m\neq i,m\neq j \text{ and } l\neq i,l\neq j \text{ then } \exists e_{m,l}\in E'. \quad (7)$$

So the new node $v'_k$ has the combined fanin and fanout of $v_i$ and $v_j$, except for any edges between the two that get absorbed in the new node and are removed from the top-level graph. In other words, nodes $v_i, v_j\in V$ are replaced by a single node $v'_k\in V'$, and $v_i, v_j\in V$ are also replaced by $v'_k\in V'$ in all directed pairs (edges) in E'.

An important observation is that if either edge $e_{i,j}$ or $e_{j,i}$ exist in E a corresponding edge does not exist in E', which prevents the generation of a self-loop. So assuming that the initial netlist has no self-loops, no new ones can be created during the execution of local moves.

If an edge $e_{i,j}\in E$ gets absorbed, then $\forall e_{m,i}\in E, e_{m,k}\in E'$ it is true that $w(e_{m,i})+w(e_{i,j})\geq w'(e_{m,k})$. This means that an absorbed edge can increase the weights of all incoming edges to the new node $v'_k\in V'$ that before the execution of the move were incoming edges to $v_i$, but at most by $w(e_{i,j})$. If $e_{i,j}\notin E$ then the local move does not change the weights of any edges. It is also important to note that such a move is only allowed when $w(e_{i,j})>0$. This is due to the fact that $w(e_{i,j})<0$ implies from definition (3) that $v_i\in TB$. A move that absorbs a token buffer is not allowed because of the special functionality that token buffers serve in the circuit guaranteeing liveness around loops.

Finally it is important to note the following relationships, since they are very useful in understanding the effects of clustering on the connectivity of the graph model of the circuit. They represent the relationship between the TFI, TFO, CTFI and CTFO of the old nodes $v_i,v_j\in V$ and the new merged node $v'\notin V'$ after the execution of a local move. These relationships can be easily derived from the definition of E' that was presented previously.

$$TFI(v')=\{TFI(v_i)\cup TFI(v_j)\}-\{v_i,v_j\}$$

$$TFO(v')=\{TFO(v_i)\cup TFO(v_j)\}-\{v_i,v_j\}$$

$$CTFI(v')=\{CTFI(v_i)\cup CTFI(v_j)\}-\{v_i,v_j\}$$

$$CTFO(v')=\{CTFO(v_i)\cup CTFO(v_j)\}-\{v_i,v_j\} \quad (8)$$

Figure 6:
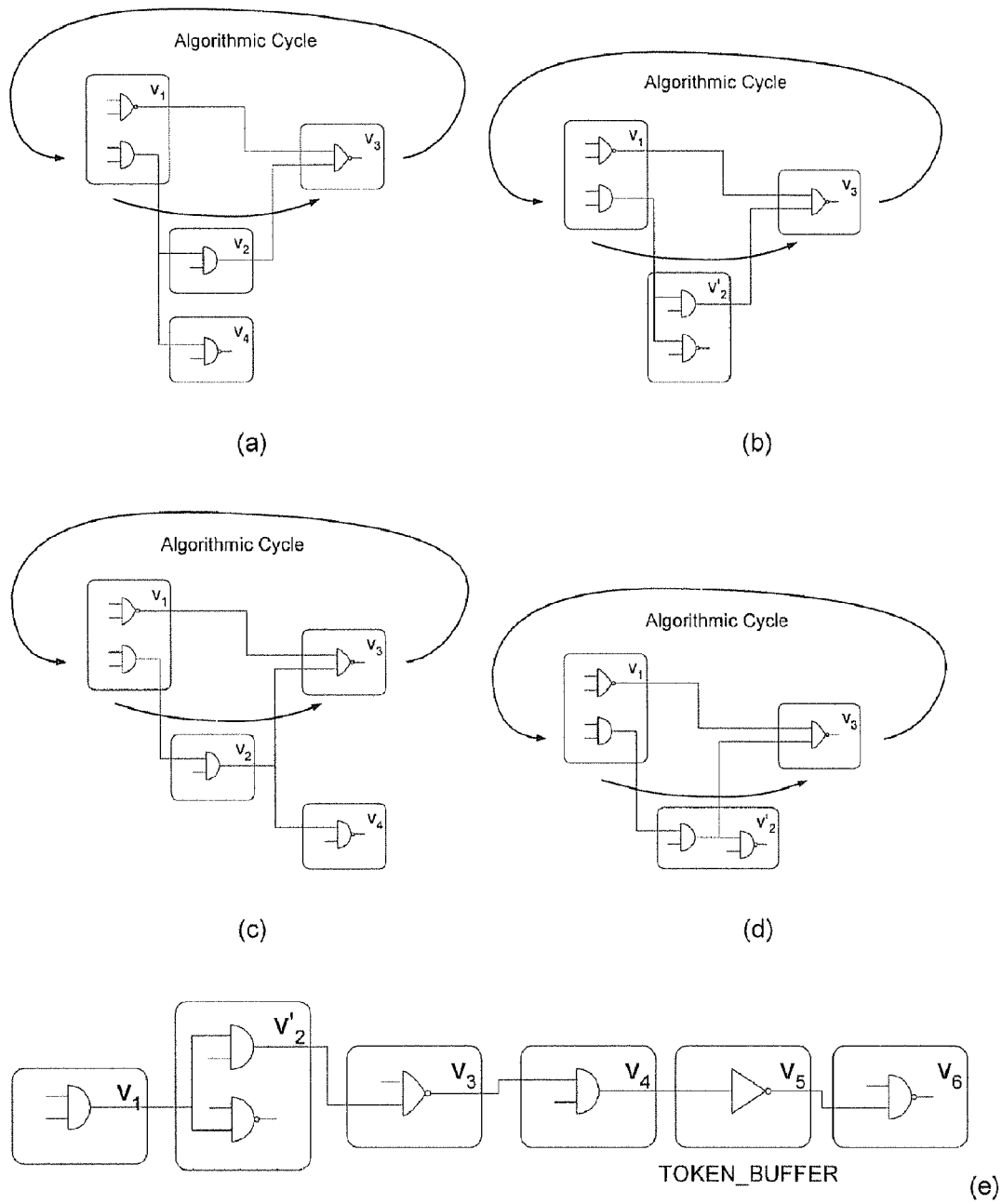
FIG. 6 includes views (a)-(f) depicting different local move scenarios impacting the algorithmic cycle time of asynchronous circuits, in accordance with embodiments of the present disclosure.

Some examples of possible moves are shown in FIG. 6(a)-(f). The drawing illustrates some of the different scenarios and the effects that they could have either on the weight function $w(e_{i,j})$ and/or on the algorithmic cycle of the circuit:

In the first scenario, which is depicted in FIGS. 6(a) and 6(b), an example is shown of two nodes merging that are part of parallel paths and hence the execution of the move does not affect the ACT of the circuit, since the levels of logic in the nodes that are part of the path that defines the ACT are unaffected.

In the second scenario, which is depicted in FIG. 6(c) and FIG. 6(d) there is an edge connecting the two nodes which gets absorbed. In this case the new logic will artificially inflate the ACT since a new level of logic is added in a node that is part of the critical path. Even though the levels do not really change in terms of the actual data path, this node will now have a delayed handshaking sequence due to the new logic, which affects the critical path. It should be noted here that additional merging with $v_3$ could remove this effect assuming this move was possible.

Figure 6F:
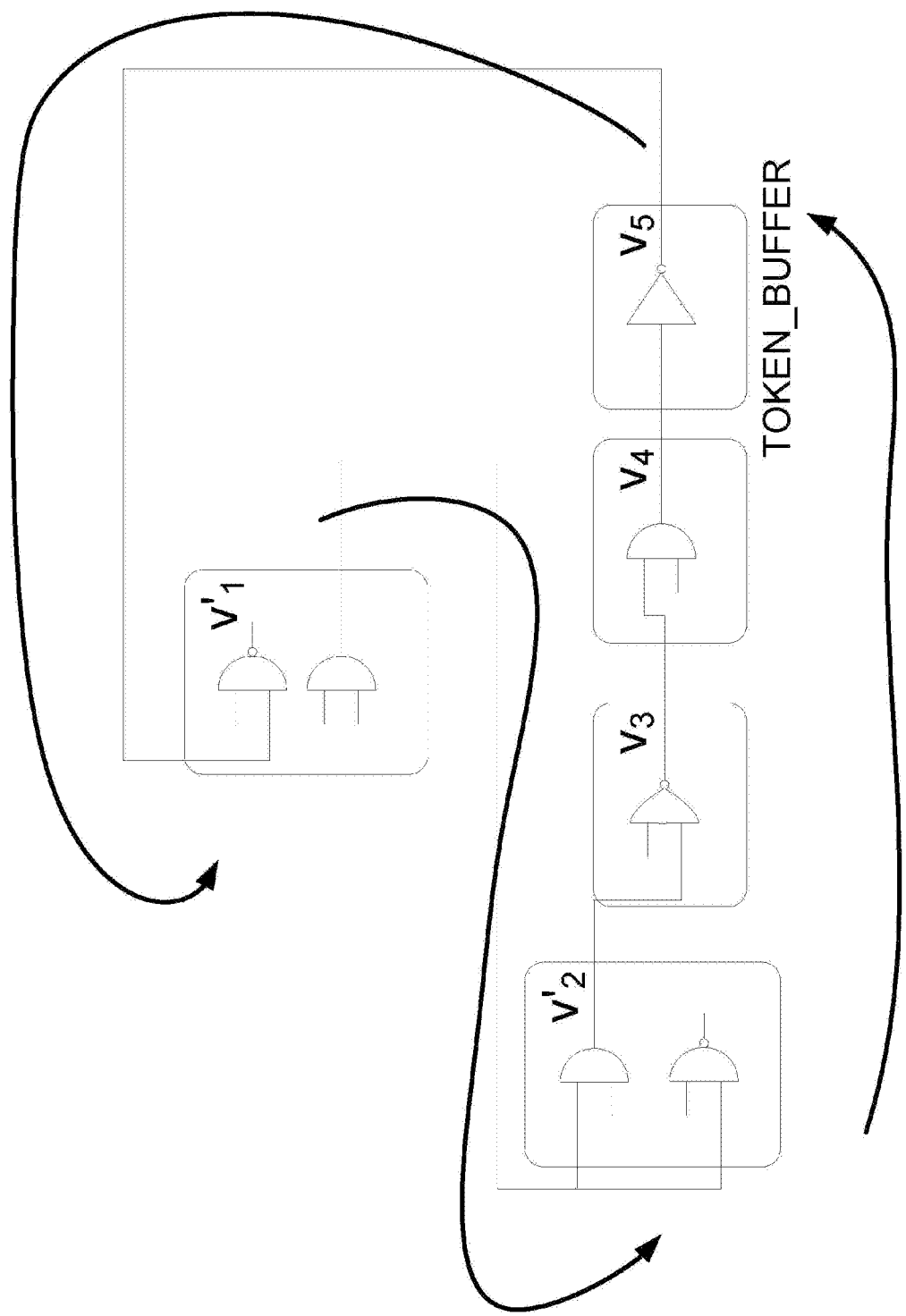

In the third scenario, which is depicted in FIGS. 6(e) and 6(f) there was no cycle (in the portion of the circuit that is depicted). After merging the two nodes $v_1$ and $v_6$, however, there is now a new cycle in the design. This cycle is again not introduced in the logic, since the circuitry is not modified by clustering, but rather it is introduced in terms of the control handshakes between the different nodes of the graph.

C.2. Clustering Criteria

Clustering is a sequence of local moves that serve the purpose of minimizing control area. Local moves can be defined as the merging of two nodes, since all merges can be broken down into this basic two-way merge, and the two-way merge is easier to characterize and study. Since every pipeline cluster will ultimately need to have its own control unit as well as left and right C-element trees for multiple fanins and fanouts, every local move results in a drop in total area.

The ultimate goal is to find the clustering of the circuit into pipeline stages that achieves the minimum overall area while hitting a target performance. Practically this means that this has to take into consideration not only the clustering process, but also the effects of slack matching and fanout optimization. Exemplary embodiments of the present disclosure can utilize a heuristic algorithm using a steepest descent approach and local constraints for the area optimizations for maintaining correctness and performance during clustering.

C.3. Ensuring Liveness

The handshaking nature of asynchronous circuits requires that one constraint is satisfied to ensure the circuit is live (also referred to as liveness of a circuit). Informally a circuit is live, if every cycle in the circuit should have at least one data TOKEN. This is guaranteed during the design process, by ensuring in every cycle in the design at least one TOKEN_BUFFER cell. A TOKEN_BUFFER is a special gate in the netlist that upon reset (or startup) will get initialized with a token (data). All other gates in the netlist are empty during initialization.

Based on the definitions described herein, the liveness criteria can be formalized in the context of the proposed graph model(s). A graph G=(V,E,h,m) is live if every cycle $p_{i,i}$ includes at least an edge e that starts at a node $v\in TB$. Based on the convention of the model, equivalently the graph is live if every cycle $p_{i,i}$ includes at least an edge $e:w(e)<0$.

However, with arbitrary clustering it is easy to see how a cycle can get created that generates a new cycle that violates this principle. So, a first desirable task can be to make sure that clustering does not destroy the liveness of a circuit and that a criterion is found that allows for prevention of all moves that could cause that from ever being executed.

C.4. Maintaining Performance

Embodiments of the present disclosure usefully define criteria so local move operations can maintain the performance of the original circuit. There are two performance measures that are preferably considered, which could potentially be enforced separately. The first one has to do with the TCT or $\tau_{goal}$. In essence what that means is that the local move should not introduce any new cycles that could make the ACT any larger than the TCT thus making the circuit slower than requested by the user. The other one has to do with end to end latency. It is sometimes important that the PI-to-PO latency in a circuit does not increase. In that case, moves should not be executed that could increase the latency from any PI to any PO in the circuit. Another limiting factor for the performance is the LCT. This is taken care of by local criteria that prevent moves from being executed that would slow down a channel to the point that it hurts performance.

C.5. Modified Floyd-Warshall Algorithm for Finding Distances

In exemplary embodiments, the Floyd-Warshall algorithm (or variations on such) is used to find all pair-wise distances in the graph so that the constraints set above can be checked quickly by a simple look-up. The algorithm is originally designed to find all the minimum pair-wise distances in a graph and cannot be used if there are any negative-weight cycles in the graph. This works well for may cases, because of the need to find the maximum distances between all pairs of nodes. And assuming that the $\tau_{alg}$ is met in the graph originally according to $\forall v_i \in V$ it is true that $d_{i,i} \leq 0$. Therefore there are no positive weight cycles in the graph, which allows to replace all min operations in the original algorithm with max operations, and still achieve convergence.

The complexity of the algorithm is $\Theta(|V|^3)$, so it is very expensive computationally. Moreover, the complexity does not change no matter how many nodes really need to be updated. After each local move is executed, the pairwise distances in the graph change and an update is required. Running the entire Floyd-Warshall algorithm was attempted for some embodiments, but it was quickly realized that this was impractical and so slow that made the use of the distance-based algorithms impractical.

A local update has been implemented that updates the array with simple operations only around the neighborhood of the new node after each move so that the Floyd-Warshall algorithm needs to run only once. However, the complexity of even one execution of the algorithm can be prohibitive for circuits that include tens of thousands of nodes. This is one of the reasons why when it comes to liveness two algorithms are utilized for some embodiments. One algorithm only requires a local search and in very large netlists where calculating all the distances is hard to do, one can choose to ignore performance in order to obtain results quickly and still maintain a functional circuit in the end of the operation, which however may or may not meet the performance requirements.

The local update that was developed to speed up the processing between move executions is extremely fast, reducing the overhead of the Floyd-Warshall to practically just the initial run that finds the initial distances. It takes advantage of the knowledge of the graph interconnect as well as the nature of the move so that it can speed up the processing and avoid updating any unnecessary values. The algorithm is shown in FIG. 7A in a pseudocode listing 700A.

The update function for the distances (update_distance_from_node) has complexity O(B|N|), where B is the average branching factor at each node and |N| is the number of nodes in the graph. It is based on the realization that each path from a node has to go through one of its fanout nodes, therefore all the distances from a given node can be calculated using just the distances to its fanout nodes and the distance vectors stored at each of the fanout nodes. This version of the algorithm was used extensively in some implementation of the distance algorithm presented herein and in practice can performs several times better than the Floyd-Warshall algorithm, however theoretically its performance could not be proven to be any better than the $O(|N|^3)$ that the Floyd-Warshall algorithm achieves, since this algorithm will not prevent a node from being visited several times.

A slightly modified version was generated for alternative embodiments and was found to have a performance that can be bound by $O(B|N|^2)$, where B is the average branching factor at each node and |N| is the number of nodes in the graph. The modified version is shown in FIG. 7B in a pseudocode listing 700B.

The algorithm shown in FIG. 7B takes advantage of the fact that the pair wise distances in the rest of the graph did not change. So first the distances of the new node to all other nodes are reset and an update is executed to calculate the distances from the new node to all other nodes using just information from its fanout. Any path from the new node to any other node has to go through its fanout so this operation is enough to give us the new distances. Then the update is executed on the fanins of the new node, so that any new paths generated by the new node are updated on its fanin. Since the distance from all other nodes to the fanins of the new node did not change a final update on all nodes of the graph using these three nodes is enough to update the entire graph. This last loop is the longest operation in this update algorithm and is executed O(B|N|) times each containing |N| updates so the total complexity of the update proposed is $O(B|N|^2)$. For the typical circuits studied by the inventors it was true that the branching factor B was negligible in size compared to the number of nodes |N| in the graph and thus for such graphs the complexity of the update was of complexity approximately equal to $O(|V|^2)$.

D. Fanout Optimization—Exemplary Embodiments

Another aspect of forks is the handling of fanout. In asynchronous circuits, there are cases where a high-fanout node has to be buffered, and the buffer that will be added alters the timing and structure of the circuit in such a way that affects the global cycle time. Even worse, in cases like SSTFB dedicated cells have to be inserted to handle nodes with fanout grater than one, and all these cells have to be included in the design in a way that does not cause performance degradation. This might imply modifying the shape of the fanout tree, or adding buffers in paths parallel to the one being altered. Generally this is a labor intensive process that currently needs to be undertaken manually during the design process. Embodiments of the present disclosure can address such issues by fanout optimization techniques/algorithms.

D.1. Slack Matching and Fanout Considerations

Slack matching can be thought as the process of properly aligning the timing of the handshakes between the pipeline stages in the design, so that a circuit can maximize its performance. If a stage generates data late, forcing another stage to wait then the receiving stage will have to stall its other inputs as it cannot process without all its inputs being present. This forward latency matching is straightforward and analogous to the latency matching that is frequently performed in synchronous circuits. In asynchronous circuits, though, it is also true that there is a backward latency, that defines the time it takes a stage to reset itself and get ready to receive data again. This forces an alignment constraint for the backward latencies as well, which is harder to visualize and which is realized in re-convergent paths. In both cases the mismatches can be handled by adding additional pipeline stages called slack buffers. The slack cells commonly are faster than regular logic cells and that allows them to be able to address larger mismatches than a common cell due to their excess slack which is defined that the difference between the circuit GCT and the cell LCT.

The slack matching problem can be modeled using a Petri net model commonly referred to as the Full-Buffer Channel Net model. As the name suggests the underlying assumption is that the stages are full-buffer stages, although in practice it has been shown to work well even for half-buffer cells. The problem can be presented as MILP problem, or an LP for some applications.

D.2. Slack Matching Fanout Tree Improvements

Slack matching adds buffers on the connections between pipeline stages to enhance the performance of the circuit. In reality slack matching creates a small buffer tree at the output of a cluster that ensures the alignment of the data at the leaf cells of the tree at the desired times. The cost of slack matching is high in many asynchronous circuit templates that could account to up to 33% of the total circuit area. Therefore it is worth investigating improvements to the existing models and methods, which could be used to reduce the area overhead that makes this process so costly.

Slack matching can be performed using the Full-Buffer-Channel-Net (FBCN) model. In the FBCN model slack matching is done on channels. Channels are point-to-point edges in the graph and are used to describe abstractly a connection between two pipeline clusters or nodes in the graph. So if a connection between the two exists, irrespective of how many physical wires it includes a single channel is created. The formulation is fairly straight forward:

$$a_j = a_i + w(e_{i,j}) + f_{i,j} + s_{i,j} * (h_{slack} + f_{slack}), \forall v_i, v_j \in V,$$

where the Goal Function is to Minimize $\Sigma s_{i,j}$

In the equation above, $a_i$, $a_j$ represent the arrival time at node $v_i$, $v_j \in V$. $f_{i,j}$ is the free slack of the channels and is equal to the difference between the TCT and the LCT for the particular channel. $s_{i,j}$ represents the number of slack cells that need to be introduced on the channel so that the circuit is slack-matched. $h_{slack}$ is the forward latency of a slack cell, which is a constant that is known at design time and $f_{slack}$ is the free slack of the slack cell, which is also constant and corresponds to the difference between the TCT and the LCT if the slack cell is inserted and depending on the complexity of the circuit can either be precisely calculated or estimated. This is because depending on the design style the LCT of the slack cell could depend on the fanin and/or fanout and/or width of the bus that is routed through it, none of which parameters are known in advance and they actually depend on the solution of the arrival time problem.

This model is fairly accurate for simple pipelines and it has been proven to work well in most cases. However, this formulation does not account for hardware optimizations that could be made and could make this model more accurate. In most design styles, it is possible that several channels leave a particular cluster for several different destinations. However all these channels could be the same wire actually forking to many targets in the netlist. So in this case it is possible to actually share any slack buffers that need to be placed for channels from the same source. The original formulation does not explore this possibility and could think that several buffers are needed in a location that one buffer could be used for all the channels that run in parallel.

FIG. 8 includes views (a)-(c) depicting placements of slack buffers, in accordance with various embodiments of the present disclosure. In most cases—assuming that the buffers are merged after slack matching anyway—this inaccuracy actually just results in the LP program overestimating the number of buffers needed. However, this problem may be further exaggerated in some cases if the LP formulation concludes that buffers are better placed in a different location. For example if a 2-input cluster has 3 fanout channels due to a wire feeding into 3 other clusters the original formulation would make the LP solver conclude that it is better to place buffers before the cluster than after it, and ultimately use 2 slack buffers instead of 1. This is shown in FIG. 8.

A modification was made to the goal function of the LP problem to reflect this inaccuracy from the goal function. The formulation of the arrival times remains identical, but an additional set of parameters is required to be stored and used for evaluation along with some extra constraints that are however linear in terms of the problem size (number of nodes). So again:

$$a_j = a_i + w(e_{i,j}) + f_{i,j} + s_{i,j} * (h_{slack} + f_{slack}), \forall v_i, v_j \in V$$

But the extra parameters $z_i$ and respective constraints were added such as $s_{i,j} \leq z_i$, with a Goal Function to Minimize $\Sigma z_i$.

And since the minimization of the sums of $z_i$ is the goal function it will be true that $$s_{i,j} \leq z_i \Leftrightarrow z_i = \max_j \{s_{i,j}\}.$$

With this formulation, the linear program solver will attempt to find the best solution assuming that it can use a line of buffers that can be shared among all the outgoing channels. This is accurate for cases that slack buffers can support arbitrary fanout and the only cases where it is problematic is situations where a particular design styles poses a hard limit on the fanout of every gate/node. In those cases it might be necessary to have buffer trees rather than buffer lines for slack.

CONCLUSION

Accordingly, embodiments of the present disclosure can be used to model an asynchronous circuit as directed graph to abstract the implementation details of the circuit. Clustering can then be performed and can include the iterative merging of nodes of the graph. Embodiments of the present disclosure demonstrate criteria that can facilitate detection and prevention of merges that could generate a transformed graph that cause deadlock. A deadlock-free maintenance criterion is expressed in two different ways for practical reasons. The first expression uses a breadth-first search in the graph while the other depends on the existence of all pair-wise distances in the graph, which is a computationally intensive process. Both have the same worst-case complexity, but the search-based one has better average-case performance and in practice is proven to be much faster. However the distance-based algorithm has the advantage that it can be seamlessly combined with criteria that help ensure target performance. Embodiments of the present disclosure can include additional criteria that help detect and prevent graph transformations that could introduce logic structures that would reduce the performance of the circuit beyond the target performance that is required for a particular design. This means that while clustering these criteria will prevent the artificial lengthening of the critical paths of the design beyond the point where it is impossible to satisfy the cycle time or the end-to-end latency constraints for the design. Embodiments of the present disclosure can provide for maintaining correctness and performance throughout the asynchronous design process. Exemplary embodiments can utilize/implement a greedy method for selecting clustering moves one at a time, e.g., a steepest-descent method/algorithm (others may be used). Non-greedy methods/algorithms can be used including, but not limited to look-ahead techniques, back-tracking techniques, dynamic programming, or multi-way merging algorithms.

Embodiments can provide Slack Matching that incorporate additional information for potential buffer sharing and thus improved the end result. Embodiments include software components and/or implementation. An exemplary embodiment of a software package was developed that enables an asynchronous ASIC flow. The software implements an end-to-end tool that reads a Verilog netlist and performs the operations described in this thesis. Embodiments can read in (or use as an input) one or more netlists (e.g., in Verilog) that are gate-level synthesized netlists from any commercial software package. Embodiments can recognize the MLD and PCHB design styles currently and can translate to fully function netlists for either design styles. Embodiments can performs clustering on a graph which is design-style-agnostic and can use all different variants of the clustering. Such cam also performs slack matching by utilizing external linear programming solvers and fanout checking (and fixing if necessary) on the netlist to guarantee that all design rules are followed. Embodiments can produce as an output (or, emit) a Verilog netlist that can be used as input to the back-end tools (applicable to any software package available) as well as test benches for both the original and final netlists and random vector generation code that allows pre- and post-software behavioral verification. The present disclosure includes other aspects applicable to general asynchronous design process and in particular in the area of RTL-based (ASIC) flow. For example, embodiments of the present disclosure include implementation of a local update algorithm for the all pair-wise distance array, e.g., as generated by a modified Floyd-Warshall algorithm, so that the array can be updated with clustering transformations with minimal local updates reducing complexity significantly.

Thus techniques are described for modeling an arbitrary gate-level circuit using a graph model and methods that allow area-reducing transformations for the gate-level circuit, which are modeled as clustering operations on the graph.

One skilled in the art will appreciate that embodiments and/or portions of embodiments of the present disclosure can be implemented in/with computer-readable storage media (e.g., hardware, software, firmware, or any combinations of such), and can be distributed and/or practiced over one or more networks. Steps or operations (or portions of such) as described herein, including processing functions to derive, learn, or calculate formula and/or mathematical models utilized and/or produced by the embodiments of the present disclosure, can be processed by one or more suitable processors, e.g., central processing units ("CPUs) implementing suitable code/instructions in any suitable language (machine dependent on machine independent).

While certain embodiments have been described herein, it will be understood by one skilled in the art that the techniques (methods, systems, and/or algorithms) of the present disclosure may be embodied in other specific forms without departing from the spirit thereof. Accordingly, the embodiments described herein, and as claimed in the attached claims, are to be considered in all respects as illustrative of the present disclosure and not restrictive.

What is claimed is:

1. A computer-executable program product for designing asynchronous circuits, the program product comprising a non-transitory, tangible, computer-readable storage medium with resident computer-readable instructions, which when loaded in a computer system causes the computer system to:
   (A) receive as an input a synchronous netlist corresponding to a synchronous circuit;
   (B) create a model of an asynchronous circuit corresponding to the synchronous circuit, wherein the model includes a directed graph having edges that represent channels and nodes that represent communication processes wherein each edge has a weight associated with the latency of a node computation and a channel communication such that (i) the maximum delay of any cycle represents the algorithmic cycle time of the circuit, which is a lower bound on the actual cycle time of the circuit, and (ii) the maximum delay from inputs to outputs represents the latency of the circuit; and
   (C) produce as an output an asynchronous netlist of an asynchronous circuit corresponding to the synchronous circuit.

2. The computer program product of claim 1, wherein the directed graph is a cyclic weighted graph.

3. The computer program product of claim 1, wherein the graph comprises nodes representing communication processes that initiate tokens upon reset, called token buffers, that have a negative component added to the weights of their outgoing edges equal to the desired global cycle time of the circuit, such that if no positive cycles in the graph exist, the algorithmic cycle time of the circuit is smaller than the desired global cycle time of the circuit.

4. The program product of claim 1, further comprising instruction to determine if the asynchronous circuit will deadlock using an analysis of combinational transitive fanouts of the graph.

5. The program product of claim 1, further comprising instruction to determine if the asynchronous circuit will deadlock using an analysis of pair-wise distances between nodes in the graph.

6. The program product of claim 1, further comprising instruction to determine the algorithmic cycle time of the asynchronous circuit using an analysis of pair-wise distances between nodes in the graph.

7. The program product of claim 1, further comprising instructions for a clustering algorithm, wherein local merging of nodes is performed subject to constraints based on both global algorithmic cycle time and latency constraints as well as deadlock analysis methods and local analysis methods based on the specific asynchronous circuit template used.

8. The program product of claim 7, wherein the clustering algorithm further comprises a greedy merging algorithm.

9. The program product of claim 7, wherein the clustering algorithm further comprises a non-greedy algorithm.

10. The program product of claim 7, further comprising instructions for using a cost function and a cost optimization algorithm.

11. The program product of claim 1, further comprising instructions for a slack-matching algorithm wherein a linear or mixed integer/linear program is used and its objective function models the area benefits of the sharing of asynchronous pipeline buffers among various fanouts.

12. The program product of claim 11, wherein the linear program uses one arrival time variable per pipeline stage.

13. The program product of claim 11, further comprising an iterative application of linear programs in which either ceiling or probabilistic approaches are used to handle implementing fractional slack with non-fractional pipeline buffers.

14. The program product of claim 11, further comprising a combination of integer and mixed-integer programming is used in which the choice of which variables can be integers is iteratively determined.

15. A computer-implemented method for designing asynchronous circuits, the method including:
  inputting to a computer system a synchronous circuit specification including clock-gating logic having a clock network and gating elements;
  removing, using the computer system, the clock network and clock gating elements from the synchronous circuit specification;
  reducing, using the computer system, circuit area of the synchronous circuit by optimizing fanout or clustering combinational gates;
  generating as an output, using the computer system, an asynchronous circuit specification corresponding to the synchronous circuit; and at least one of the following:
  application to a PCHB circuit including a 1-dimensional set of logic gates, a local asynchronous controller, and C-element trees that are configured and arranged to merge in-coming acknowledgement circuitry; or
  application to a Multi-Level Domino circuit including a plurality of logic gates multiple levels deep, one or more local asynchronous controllers, a completion-detection unit, and C-element trees that are configured and arranged to merge incoming acknowledgements.

16. The method of claim 15, further comprising application to a PCHB circuit including a 1-dimensional set of logic gates, a local asynchronous controller, and C-element trees that are configured and arranged to merge in-coming acknowledgement circuitry.

17. The method of claim 15, further comprising application to a Multi-Level Domino circuit including a plurality of logic gates multiple levels deep, one or more local asynchronous controllers, a completion-detection unit, and C-element trees that are configured and arranged to merge incoming acknowledgements.

18. A non-transitory, tangible, computer-executable program product including programming instructions which, when run by a computer, cause a clustering algorithm to be performed based on both global algorithmic cycle time and latency constraints, a deadlock analysis that checks for liveness, and local analysis of a specific asynchronous circuit template; and at least one of the following:
  wherein the clustering algorithm further comprises a non-greedy algorithm, and
  wherein the non-greedy algorithm is selected from the group consisting of a look-ahead technique;
  further comprising instructions for application to a PCHB circuit including a 1-dimensional set of logic gates, a local asynchronous controller, and C-element trees that are configured and arranged to merge in-coming acknowledgement circuitry; or
  further comprising instructions for application to a Multi-Level Domino circuit including a plurality of logic gates multiple levels deep, one or more local asynchronous controllers, a completion-detection unit, and C-element trees that are configured and arranged to merge incoming acknowledgements.

19. The program product of claim 18, wherein the clustering algorithm further comprises a greedy merging algorithm.

20. The program product of claim 18, wherein the clustering algorithm further comprises a non-greedy algorithm.

21. The program product of claim 20, wherein the non-greedy algorithm is selected from the group consisting of a look-ahead technique, a back-tracking technique, a dynamic programming technique, and multi-way merging.

22. The program product of claim 18, further comprising instructions for application to a PCHB circuit including a 1-dimensional set of logic gates, a local asynchronous controller, and C-element trees that are configured and arranged to merge in-coming acknowledgement circuitry.

23. The program product of claim 18, further comprising instructions for application to a Multi-Level Domino circuit including a plurality of logic gates multiple levels deep, one or more local asynchronous controllers, a completion-detection unit, and C-element trees that are configured and arranged to merge incoming acknowledgements.

* * * * *